United States Patent
Kehl

(10) Patent No.: US 8,284,083 B2
(45) Date of Patent: Oct. 9, 2012

(54) DIGITAL ANALOG CONVERTER CIRCUIT AND METHOD FOR FAULT DETECTION

(75) Inventor: Natalja Kehl, Obersulm (DE)

(73) Assignee: Robert Bosch GmbH, Stuttgart (DE)

( * ) Notice: Subject to any disclaimer, the term of this patent is extended or adjusted under 35 U.S.C. 154(b) by 95 days.

(21) Appl. No.: 12/880,802

(22) Filed: Sep. 13, 2010

(65) Prior Publication Data

US 2011/0068963 A1    Mar. 24, 2011

(30) Foreign Application Priority Data

Sep. 16, 2009   (DE) .......................... 10 2009 029 519

(51) Int. Cl.
*H03M 1/06* (2006.01)

(52) U.S. Cl. ....................................... 341/118; 341/144

(58) Field of Classification Search ................. 341/118, 341/120, 155, 144, 150, 163; 327/276; 324/76.15, 324/378

See application file for complete search history.

(56) References Cited

U.S. PATENT DOCUMENTS 5,583,502 A     12/1996  Takeuchi et al.
2009/0061801 A1*  3/2009  Kobayashi ................. 455/150.1

* cited by examiner

*Primary Examiner* — Joseph Lauture
(74) *Attorney, Agent, or Firm* — Kenyon & Kenyon LLP

(57) ABSTRACT

A digital-analog converter circuit having a first subcircuit for converting a digital signal to an analog voltage, a second subcircuit for determining a first area in which the digital signal lies, a third subcircuit for determining a second area in which the analog voltage lies, and a fourth subcircuit for comparing the first and the second area. Also, a method for fault detection in a digital-analog converter circuit.

11 Claims, 3 Drawing Sheets

DIGITAL ANALOG CONVERTER CIRCUIT AND METHOD FOR FAULT DETECTION

FIELD OF THE INVENTION

The present invention relates to a digital-analog converter circuit as well as a method for fault detection in a digital-analog converter circuit (D-A converter).

BACKGROUND INFORMATION

Digital-analog converters (DAC's) are known in the most diversified specific embodiments and are always used when digital numerical values, which are stored, for instance, in a storage component have to be converted to (quasi) analog voltages.

A fault in a DAC often leads to functional disturbances in the entire circuit. If a chip manufacturer guarantees a certain maximum fault rate, this may be maintained possibly only by using fault detection circuits or testing circuits.

Such a D-A testing circuit is shown in U.S. Pat. No. 5,583,502, in which several D-A converters are required for the test, which leads to a relatively high hardware expenditure. Also, in the circuit described there, no testing can be carried out during normal operation. Rather, test signals are applied to special test terminals in order to check the functionality of the D-A converters.

It is therefore desirable to simplify the fault detection in a D-A converter circuit and particularly to make it available online, i.e. during the running time.

SUMMARY OF THE INVENTION

The present invention provides a digital-analog converter circuit as well as a method for fault detection.

The present invention is based on the idea that a simple fault detection, and one that is particularly able to be carried out online, is able to be provided if a number of areas is specified which span the total amplitude of the output signal, and it is checked whether the analog output signal moves in a range that is to be expected, based on the digital input signal. Such a circuit is particularly easy to implement since, in addition to the D-A converter circuit, that is present anyway, essentially only a number of logic gates, switches and possibly operational amplifiers will be needed. In particular, for checking a D-A converter, no additional D-A converter is required. By subdivision into areas, mainly faults of the respectively higher-order bits are detected, since the latter essentially specify the association with an area. Consequently, a particularly low-cost fault detection may be provided. Online, i.e. essentially during the D-A conversion, it is possible to detect faults which are occurring in the higher-order bits, and which thus especially greatly corrupt the output signal.

A digital-analog converter circuit includes a number of subcircuits which may also have common components. It is especially possible that a plurality of subcircuits is totally or partially implemented by one circuit.

The subcircuit for converting a digital signal to an analog voltage may include an R2R network. It should be understood, however, that all types of D-A converters are suitable as subcircuits of the D-A converter according to the present invention.

The subcircuit preferably includes at least one window comparator to determine the area in which the analog voltage lies. In this context, one may use a switchable window comparator or a number of window comparators having fixed limiting voltages. Window comparators offer a possibility, that is simple to provide, of subdividing the maximum amplitudes of the analog signal or an analog voltage into a number of areas. The window comparators are preferably designed so that they provide a logical one at their output, if the analog voltage is in the respective voltage range of the window comparator. A switchable window comparator has the advantage of requiring less area on the component than a corresponding number of switchable comparators.

DETAILED DESCRIPTION

Figure 1:
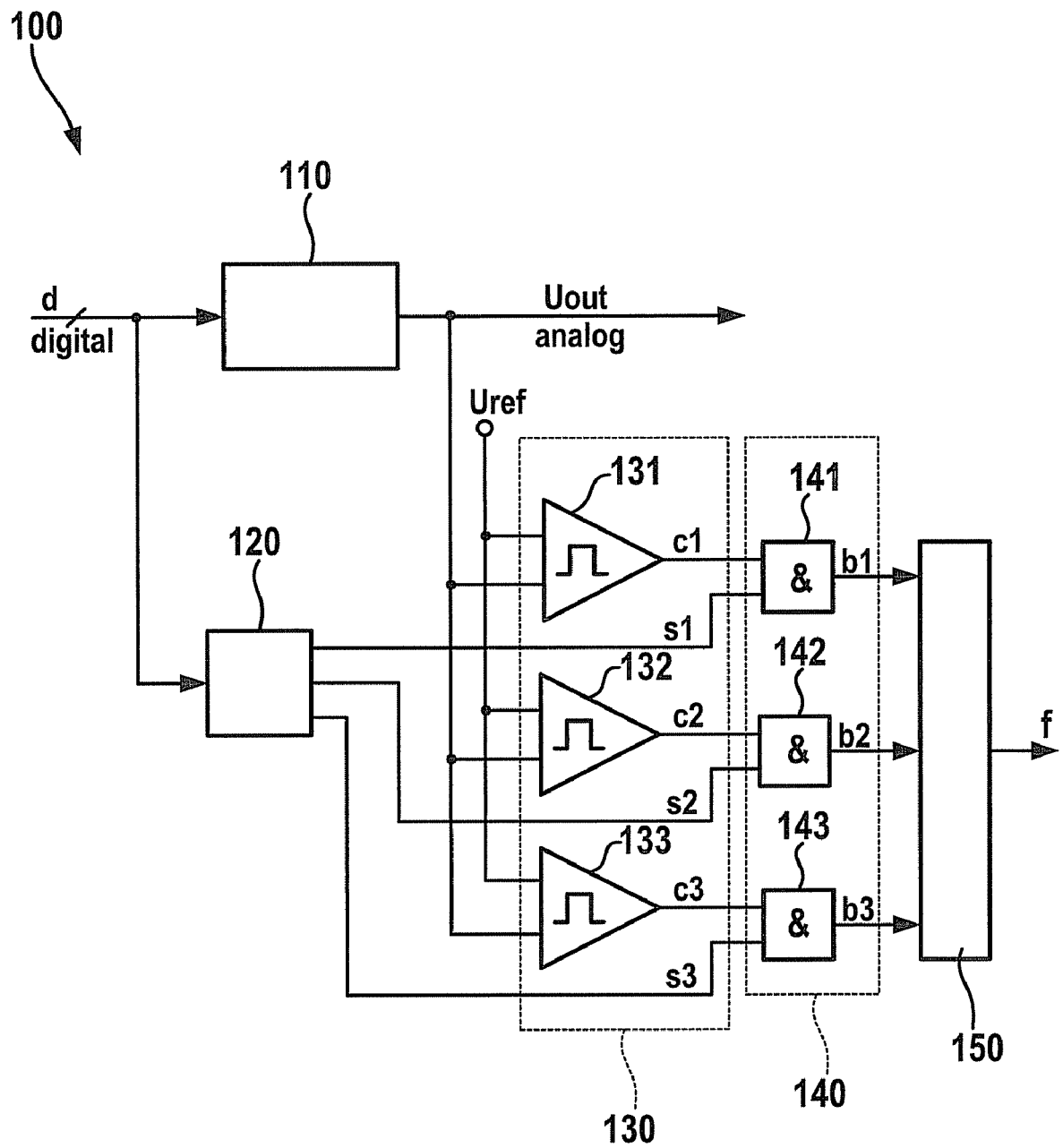
FIG. 1 shows a circuit diagram of a first preferred specific embodiment of a D-A converter circuit according to the present invention.

FIG. 1 shows a circuit configuration of a first preferred specific embodiment 100 of a D-A converter circuit. The D-A converter circuit converts a digital signal d to an analog voltage $U_{out}$. To do this, it has a first subcircuit 110 for converting digital signal d to analog voltage $U_{out}$. First subcircuit 110 may be designed as an R2R network, for example, or may include any other type of DAC.

For checking or fault recognition, D-A converter circuit 100, in addition, has a second subcircuit 120 to determine a first area in which digital signal d lies, a third subcircuit 130 to determine a second area in which analog voltage $U_{out}$ lies, as well as a fourth subcircuit 140 for comparing the first and second areas. D-A converter circuit 100 also has a fifth subcircuit 150 for providing a fault signal f with the aid of an evaluation of the output of fourth subcircuit 140.

Second subcircuit 120 is developed as a selector, in this instance, which has one input, as well as three outputs s1, s2 and s3 in the example shown. The selector is prepared to determine the first area in which digital signal d is present. For this purpose, it is developed internally, for example, of a number of logic gates, in order to provide the following truth table, for the present example of a 3-bit digital input signal d (d0, d1, d2).

| Digital Signal | | | Selector | | | |
| --- | --- | --- | --- | --- | --- | --- |
| d2 | d1 | d0 | s3 | s2 | s1 | Area |
| 0 | 0 | 0 | 1 | 0 | 0 | 3 |
| 0 | 0 | 1 | 1 | 0 | 0 | |
| 0 | 1 | 0 | 1 | 0 | 0 | |
| 0 | 1 | 1 | 0 | 1 | 0 | 2 |
| 1 | 0 | 0 | 0 | 1 | 0 | |
| 1 | 0 | 1 | 0 | 1 | 0 | |
| 1 | 1 | 0 | 0 | 0 | 1 | 1 |
| 1 | 1 | 1 | 0 | 0 | 1 | |

The assignment of the digital values to the areas is left to one skilled in the art. Third subcircuit 130 is developed to determine the second area in which the analog voltage $U_{out}$ lies. In the example shown, third subcircuit 130 includes three window comparators 131, 132 and 133, for which different voltage windows are provided. The voltage windows and the voltage areas of window comparators 131, 132 and 133 are expediently designed in such a way that they define the possible voltage output area (0-Umax) of DAC 110. One specific embodiment that is possible for this, for example, will be explained, with the aid of FIG. 3, below. Window comparators 131 to 133 indicate at their respective outputs c1, c2 and c3 whether the input voltage $U_{out}$ lies in the respectively assigned voltage window. If voltage $U_{out}$ lies in the respective voltage window, the signal "1" is output to the appertaining output c1, c2 and c3, otherwise the signal "0" is output.

Fourth subcircuit 140 is developed to compare the first area to the second area. In the example shown, it has three AND gates 141, 142, 143 to do this, which are connected respectively to one of outputs s1, s2, s3 of second subcircuit 120 as well as to one of outputs c1, c2, c3 of third subcircuit 130. In the example shown, fourth subcircuit 140, in turn, has three outputs b1, b2, b3, for indicating the result.

Fifth subcircuit 150 is developed, in this case, as a detector for generating fault signal f, based on output b1, b2, b3 of fourth subcircuit 140. In this context, for example, detector 150 generates the fault signal with the aid of an additional truth table. In the example shown, the circuit operates without fault exactly when only one of input signals b0, b1, b2 is active, or rather, is "1". This is shown by the following truth table of the detector.

| b2) | b1) | b0 | f |
|---|---|---|---|
| 0 | 0 | 0 | 1 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

Circuit 100 detects those faults in the D-A conversion in which higher order bits have been corrupted. Let us say, for example, that the value $d=7_d=111_b$ is to be converted, and if the MSB (most significant bit) is corrupted, because a stuck at error, for instance, has occurred in the corresponding current path, the false value $011_b=3_d$ is converted. This leads to s1=1 and c3=1. All other signals ci and si are zero. This leads to all signals bi (i=1 . . . 3) being zero, so that, in this case, the detector outputs an error.

Possible limiting voltages of the three comparators 131, 132 and 133 are explained below with the aid of FIG. 4. As explained below in light of FIG. 3, these limiting voltages are able to be adjusted via internal resistances of the individual window comparators.

Figure 3:
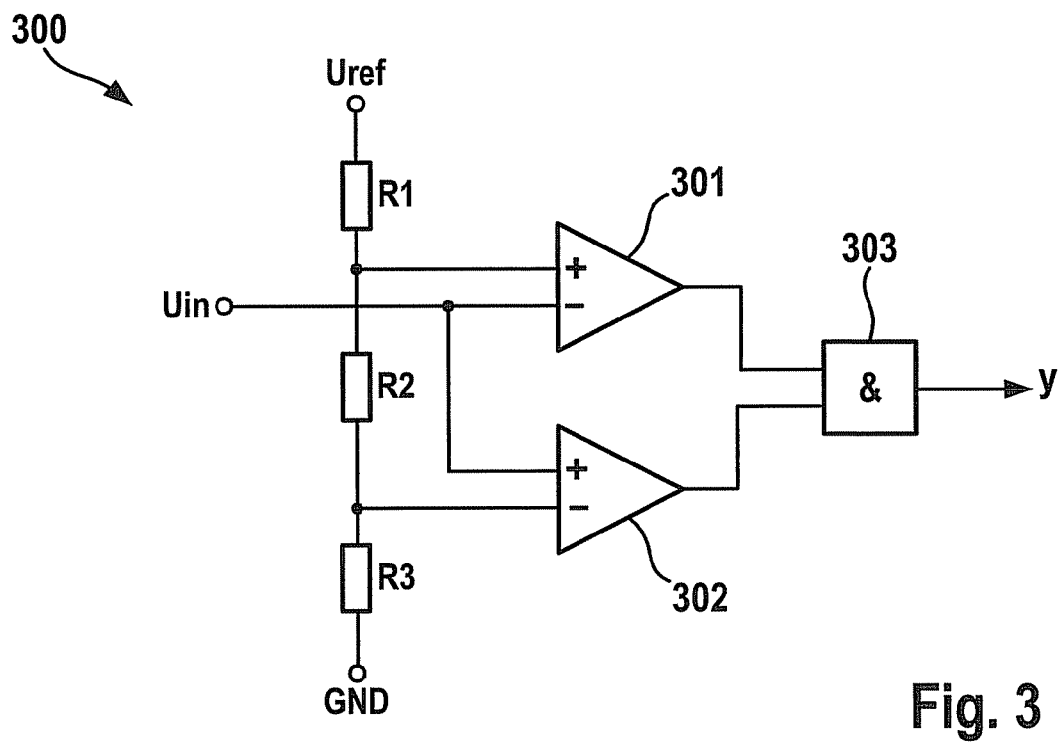
FIG. 3 shows a circuit configuration of a possible specific embodiment of a window comparator.
Figure 4:
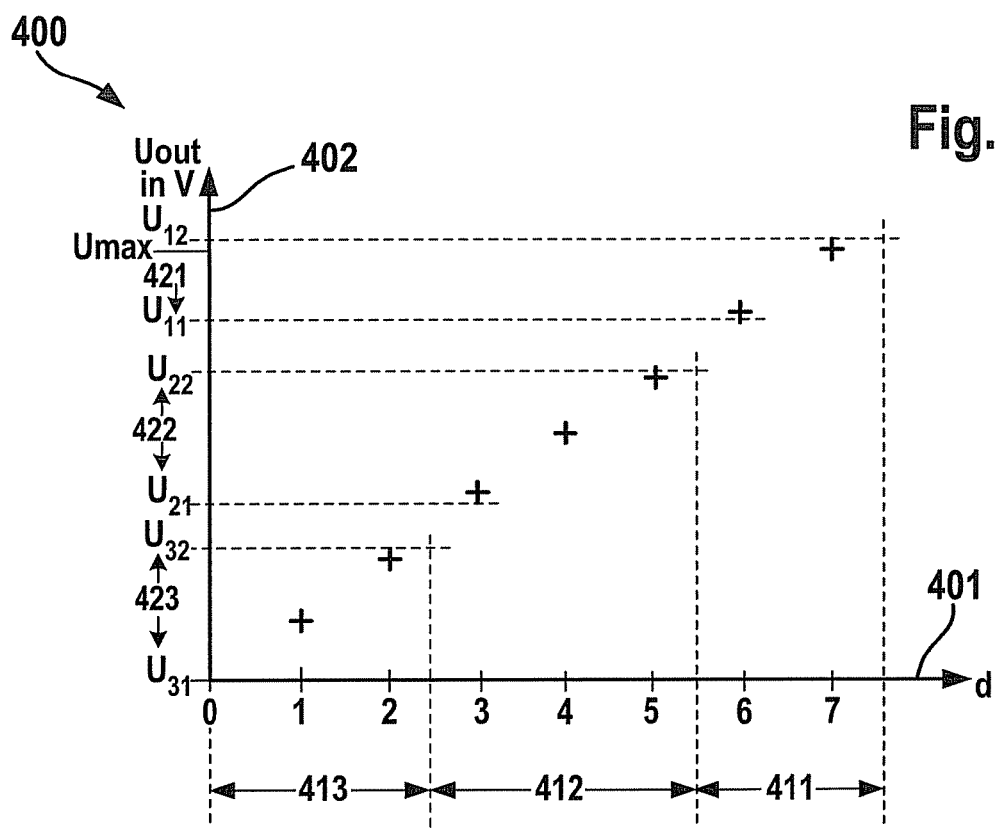
FIG. 4 shows a possible subdivision of an analog output voltage into a number of areas.

FIG. 3 shows a circuit diagram of a window comparator 300 that may be used for the present invention. The window comparator is fed by a supply voltage $U_{ref}$ to ground GND. Window comparator 300 has an input for an input voltage signal $U_{in}$, which is tested with respect to a voltage window defined by three resistors R1, R2, R3. For this, voltage signal $U_{in}$ is guided to an inverting input of a first operational amplifier 301 and to a non-inverting input of a second operational amplifier 302. The outputs of operational amplifiers 301 and 302 are connected to an AND gate 303, which provides an output signal y of window comparator 300, with the aid of a comparison of the output signal of operational amplifier 301 and 302.

The pass band width of the window comparator is established via resistors R1, R2 and R3, which are internal to the comparator. The two equations below apply to the limiting voltages of the comparator:

$$U_1 = \frac{R_3}{R_1 + R_2 + R_3} U_{ref}$$

$$U_2 = \frac{R_3 + R_2}{R_1 + R_2 + R_3} U_{ref}$$

Then the following applies for the digital output signal y of the window comparator:

$$y = \begin{cases} 1 & U_1 \langle U_m \langle U_2 \\ 0 & \text{otherwise} \end{cases}$$

The area between voltages $U_1$ and $U_2$ is the so-called window. At the output, the window comparator yields "1" if the input signal $U_{in}$ is located within the window area, and otherwise "0". Signal y corresponds to signals c1, c2 and c3, according to FIG. 1, or signal f according to FIG. 2.

Figure 2:
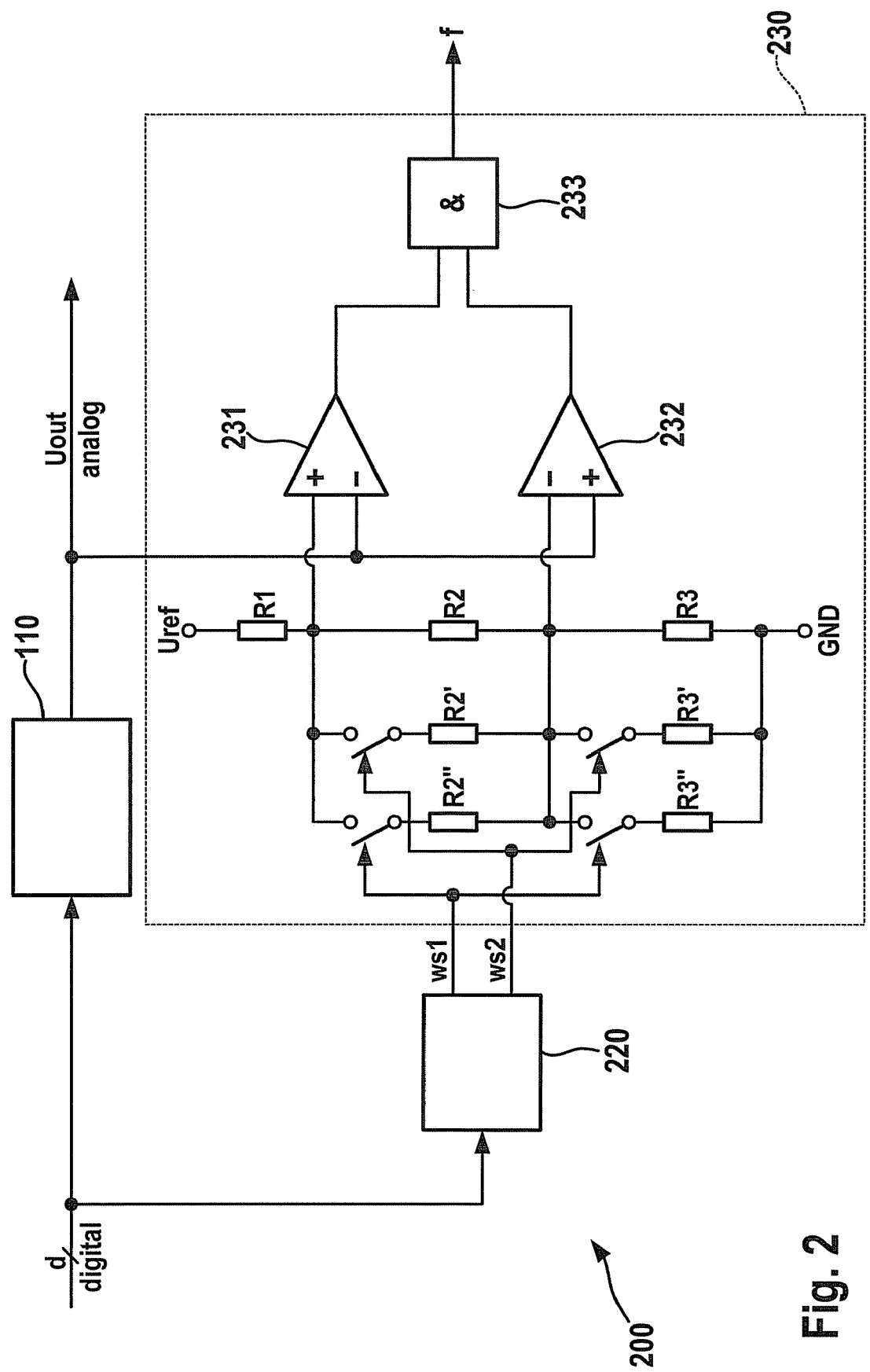
FIG. 2 shows a circuit diagram of a second preferred specific embodiment of a D-A converter circuit according to the present invention.

An alternative specific embodiment 200 of a D-A converter circuit is shown in FIG. 2. We shall explain below only the differences from circuit 100 according to FIG. 1. Circuit 200 differs from circuit 100 according to FIG. 1 in particular by the fact that a switchable window comparator is used.

The window area of this comparator is variable, and is able to be changed by the switching on and off of various resistors R1, R2, R2', R2'', R3, R3', R3''. The voltage dividers composed of the resistors are switched in or out by the second subcircuit, developed here as window selector 220.

In a manner analogous to selector 120 according to FIG. 1, window selector 220 determines the currently valid window from digital input signal d, and outputs corresponding signals at its outputs ws1 and ws2. For this purpose, it is developed internally, for example, of a number of logic gates, in order to provide the following truth table, for the present example of a 3-bit digital signal d (d0, d1, d2):

| Digital signal | | | Window selector | | |
|---|---|---|---|---|---|
| d2 | d1 | d0 | ws2 | ws1 | Area |
| 0 | 0 | 0 | 0 | 0 | 3 |
| 0 | 0 | 1 | 0 | 0 | |
| 0 | 1 | 0 | 0 | 0 | |
| 0 | 1 | 1 | 0 | 1 | 2 |
| 1 | 0 | 0 | 0 | 1 | |
| 1 | 0 | 1 | 0 | 1 | |
| 1 | 1 | 0 | 1 | 0 | 1 |
| 1 | 1 | 1 | 1 | 0 | |

The subdivision of the value area of the D-A converter into subareas corresponds to the subdivision according to FIG. 1, in this instance.

The third subcircuit for determining the second area, in which analog voltage $U_{out}$ lies, the fourth subcircuit for comparing the first and the second areas and the fifth subcircuit for providing fault signal f are implemented, in this case, in a common circuit 230.

Circuit 230 includes the switchable window comparator, which has resistors R1, R2, R2', R2'', R3, R3', R3'', two operational amplifiers 231 and 232, as well as an AND gate 233. The functional manner of a window comparator will be explained further below with reference to FIG. 3.

The window comparator is switchable, the respective limiting voltages being adjusted by the resistors according to the following equation system:

$$U_{11} = \frac{R_3}{R_1 + R_2 + R_3} U_{ref}$$

$$U_{12} = \frac{R_2 + R_3}{R_1 + R_2 + R_3} U_{ref}$$

$$U_{21} = \frac{R_2 \| R_3'}{R_1 + R_2 \| R_2' + R_3 \| R_3'} U_{ref}$$

$$U_{22} = \frac{R_2 \| R_2' + R_3 \| R_3'}{R_1 + R_2 \| R_2' + R_3 \| R_3'} U_{ref}$$

$$U_{31} = \frac{R_3 \| R_3''}{R_1 + R_2 \| R_2'' + R_3 \| R_3''} U_{ref}$$

$$U_{32} = \frac{R_2 \| R_2'' + R_3 \| R_3''}{R_1 + R_2 \| R_2'' + R_3 \| R_3''} U_{ref}$$

$$\text{where } R_x \| R_y = \frac{R_x \cdot R_y}{R_x + R_y}$$

A possible adjustment of voltages $U_{ij}$ will be explained with reference to FIG. 4. FIG. 4 shows a possible voltage subdivision for a 3-bit digital value in a diagram 400. The desired analog output voltage $U_{out}$ is plotted on the ordinate 402 against the digital input value d of a 3-bit number on the abscissa 401. The 3-bit digital value is able to represent eight (0-7) possible voltages. In the present example, to simplify things, a voltage subdivision of 1 V is provided at the same time, so that the analog voltage in volts should correspond to the numerical value of the digital input signal. In the specific embodiment shown here, a subdivision into three first (digital) areas 411, 412 and 413 is performed, as well as, correspondingly, three second (analog) areas 421, 422, 423. It should be understood that a smaller or a larger number of possible areas could also be provided.

In the example shown, first areas 411 to 413 are developed in such a way that they each include two or three digital values. Thus, area 411 includes the values 7 and 6, area 412 includes the values 5, 4 and 3, and area 413 includes the values 2, 1 and 0. The second (analog) areas 421, 422 and 423 are defined by their respective limiting voltages $U_{11}$-$U_{12}$, $U_{21}$-$U_{22}$ and $U_{31}$-$U_{32}$. In the present example, the following limiting voltages were selected:

| Area | Lower limiting voltage | Upper limiting voltage |
|------|------------------------|------------------------|
| 421  | $U_{11}$ = 5.9 V       | $U_{12}$ = 7.1 V       |
| 422  | $U_{21}$ = 3.9 V       | $U_{22}$ = 5.1 V       |
| 423  | $U_{31}$ = 0 V         | $U_{32}$ = 3.1 V       |

In FIG. 1, area 421 would be assigned to window comparator 131, area 422 to window comparator 132 and area 423 to window comparator 133.

What is claimed is:

1. A digital-analog converter circuit comprising:
   a first subcircuit for converting a digital signal to an analog voltage;
   a second subcircuit for determining a first area in which the digital signal lies;
   a third subcircuit for determining a second area in which the analog voltage lies;
   a fourth subcircuit for comparing the first area and the second area; and
   a fifth subcircuit for providing a fault signal with the aid of an output of the fourth subcircuit.

2. The digital-analog converter circuit according to claim 1, wherein the fourth subcircuit and the fifth subcircuit are implemented in one subcircuit.

3. The digital-analog converter circuit according to claim 1 or 2, wherein the third subcircuit includes at least one window comparator.

4. The digital-analog converter circuit according to claim 3, wherein the third subcircuit includes a window comparator for the second area.

5. The digital-analog converter circuit according to claim 3, wherein the third subcircuit includes a switchable window comparator.

6. The digital-analog converter circuit according to claim 3, wherein the third subcircuit includes a window comparator for the second area, and wherein the fourth sub circuit includes at least one AND gate or a NAND gate.

7. The digital-analog converter circuit according to claim 3, wherein the third subcircuit includes a switchable window comparator, and wherein the fourth subcircuit includes at least one AND gate or a NAND gate.

8. The digital-analog converter circuit according to any of claim 1 or 2, wherein the fourth subcircuit includes at least one AND gate or a NAND gate.

9. The digital-analog converter circuit according to claim 1, wherein at least one subcircuit includes a number of logic gates.

10. A method for fault detection in a digital-analog converter circuit, comprising:
    converting a digital signal to an analog voltage;
    determining a first area in which the digital signal lies;
    determining a second area in which the analog voltage lies;
    determining whether the first area corresponds to the second area; and
    detecting a fault if the first area does not correspond to the second area.

11. The method according to claim 10, wherein the fault detection is carried out at substantially the same time as the signal conversion.

* * * * *